United States Patent
Ariyama

(10) Patent No.: US 8,106,646 B2
(45) Date of Patent: *Jan. 31, 2012

(54) SENSOR CIRCUIT

(75) Inventor: Minoru Ariyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 183 days.

This patent is subject to a terminal disclaimer.

(21) Appl. No.: 12/614,924

(22) Filed: Nov. 9, 2009

(65) Prior Publication Data

US 2010/0117637 A1    May 13, 2010

(30) Foreign Application Priority Data

Nov. 13, 2008  (JP) ................................ 2008-291393

(51) Int. Cl.
*G01R 15/20* (2006.01)
*G01R 15/18* (2006.01)
*G01R 33/00* (2006.01)

(52) U.S. Cl. ................ 324/117 H; 324/117 R; 324/225

(58) Field of Classification Search .............. 324/117 H, 324/117 R, 250–252, 225, 720, 721, 706; 327/512, 68, 513; 702/58–62, 130–136

See application file for complete search history.

(56) References Cited

U.S. PATENT DOCUMENTS

| 4,020,487 A * | 4/1977 | Winter .......................... 341/170 |
| 2010/0117715 A1 * | 5/2010 | Ariyama ....................... 327/512 |

FOREIGN PATENT DOCUMENTS

JP           10-253728 A        9/1998

* cited by examiner

*Primary Examiner* — Huy Q Phan
*Assistant Examiner* — Tung X Nguyen
(74) *Attorney, Agent, or Firm* — Brinks Hofer Gilson & Lione

(57) ABSTRACT

Provided is a sensor circuit that is small in circuit scale, but is capable of temperature compensation. A reference voltage circuit (BL1) which compensates a temperature includes only a voltage divider circuit, and hence the sensor circuit is small in circuit scale. The sensor circuit is also capable of temperature compensation because temperature changes of a reference voltage (VTH1) and a reference voltage (VTH2) match a temperature change of an output signal (OUTA) of an amplifier circuit (AMP1) which is caused by a temperature change of an output signal of a Hall element (HAL1).

6 Claims, 7 Drawing Sheets

SENSOR CIRCUIT

RELATED APPLICATIONS

This application claims priority under 35 U.S.C. §119 to Japanese Patent Application No. 2008-291393 filed on Nov. 13, 2008, the entire content of which is hereby incorporated by reference.

BACKGROUND OF THE INVENTION

1. Field of the Invention

The present invention relates to a sensor circuit.

2. Description of the Related Art

Today's electronic devices are mounted with various sensor circuits. For example, a magnetic sensor circuit which detects the magnetism of a magnet is installed in one electronic device. This electronic device has a mechanism for folding a part of its main body. The folding mechanism has a magnet and a magnetic sensor circuit. Opening and closing the folding mechanism causes a change in distance between the magnet and the magnetic sensor circuit, thus changing the magnetic flux density of a magnetic field generated by the magnet, which is applied to the sensor circuit. A magnetic flux density equal to or larger than a given value means that the folding mechanism is open, and a magnetic flux density smaller than the given value means that the folding mechanism is closed.

An output signal of a sensor circuit in general has a temperature coefficient. Some sensor circuits are equipped with a temperature compensation circuit which compensates the temperature in order to cancel out the temperature coefficient.

A temperature compensation circuit installed in a conventional magnetic sensor circuit is described. FIG. 10 is a diagram illustrating a temperature compensation circuit installed in a conventional magnetic sensor circuit.

A current source 14 supplies a current that has a temperature coefficient to a current source 5 based on a constant voltage from a band gap reference voltage generating circuit 11. A current from the current source 5 drives sensor elements 2 and 3. The temperature coefficient of the current from the current source 14 cancels out the temperature coefficient of an output signal of the sensor circuit (see JP 10-253728 A, for example).

However, the band gap reference voltage generating circuit 11 and various current sources necessary for temperature compensation increase the circuit scale.

SUMMARY OF THE INVENTION

The present invention has been made in view of the problem described above, and an object of the present invention is therefore to provide a sensor circuit that is small in circuit scale, but is capable of temperature compensation.

In order to solve the problem described above, the present invention provides a sensor circuit including: a sensor element which outputs an output signal that has a first temperature coefficient based on an external factor; an amplifier circuit which amplifies the output signal of the sensor element, and which outputs an output signal that has a second temperature coefficient based on the first temperature coefficient; a reference voltage circuit which includes a voltage divider circuit and a temperature compensating resistor, and which outputs a reference voltage, the voltage divider circuit including a plurality of resistors that have the same temperature coefficient, the temperature compensating resistor having a temperature coefficient different from the temperature coefficient of the plurality of resistors, the reference voltage having a third temperature coefficient, which is substantially equal to the second temperature coefficient; and a comparator circuit which compares the output signal of the amplifier circuit and the reference voltage of the reference voltage circuit to output one of a High signal and a Low signal when the output signal of the amplifier circuit is equal to or larger than the reference voltage of the reference voltage circuit, and to output another one of the Low signal and the High signal when the output signal of the amplifier circuit is smaller than the reference voltage of the reference voltage circuit.

In the present invention where the reference voltage circuit which compensates the temperature includes only the voltage divider circuit, the sensor circuit is small in circuit scale.

The sensor circuit of the present invention is also capable of temperature compensation because a temperature change of the reference voltage matches a temperature change of the output signal of the amplifier circuit which is caused by a temperature change of the output signal of the sensor element.

DETAILED DESCRIPTION OF THE PREFERRED EMBODIMENTS

Embodiments of the present invention are described below with reference to the drawings.

First Embodiment

Figure 1:
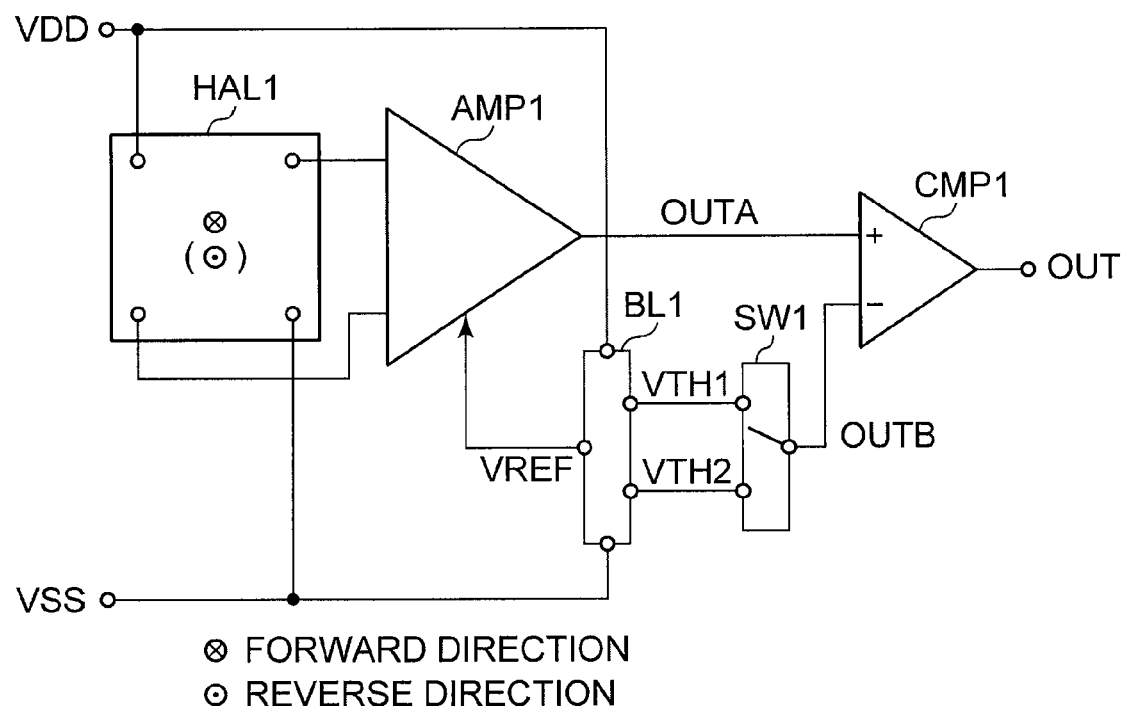
FIG. 1 is a diagram illustrating a sensor circuit.

The structure of a sensor circuit is described first. FIG. 1 is a diagram illustrating a sensor circuit.

The sensor circuit includes a Hall element HAL1, an amplifier circuit AMP1, a comparator circuit CMP1, a reference voltage circuit BL1, and a switch circuit SW1.

The Hall element HAL1 has a first terminal, which is connected to a supply terminal, a second terminal, which is connected to a ground terminal, a third terminal, which is connected to a first input terminal of the amplifier circuit AMP1, and a fourth terminal, which is connected to a second input terminal of the amplifier circuit AMP1. The amplifier circuit AMP1 has a reference voltage terminal, which is connected to a reference voltage terminal of the reference voltage circuit BL1, and an output terminal, which is connected to a non-inverting input terminal of the comparator circuit CMP1. An inverting input terminal of the comparator circuit CMP1 is connected to an output terminal of the switch circuit SW1.

The reference voltage circuit BL1 has a first output terminal, which is connected to a first input terminal of the switch circuit SW1, and a second output terminal, which is connected to a second input terminal of the switch circuit SW1.

The operation of the sensor circuit is described next.

A magnetic field is applied to the Hall element HAL1. Based on the magnetic flux density and direction of the magnetic field and a supply voltage VDD of the supply terminal, the Hall element HAL1 outputs an output signal that has a temperature coefficient (Hall voltage) to the amplifier circuit AMP1. The output signal of the Hall element HAL1 is amplified by the amplifier circuit AMP1. The amplifier circuit AMP1 outputs an output signal OUTA, which has a temperature coefficient based on the temperature coefficient of the output signal of the Hall element HAL1, to the non-inverting input terminal of the comparator circuit CMP1. The reference voltage circuit BL1 outputs reference voltages VTH1 and VTH2 to the switch circuit SW1. The switch circuit SW1 chooses one of these reference voltages that has a temperature coefficient substantially equal to that of the output signal OUTA, and inputs the chosen reference voltage to the inverting input terminal of the comparator circuit CMP1 as a reference voltage OUTB. The comparator circuit CMP1 compares the output signal OUTA and the reference voltage OUTB, and outputs a High signal as an output signal OUT when the output signal OUTA is equal to or larger than the reference voltage OUTB, and outputs a Low signal as the output signal OUT when the output signal OUTA is smaller than the reference voltage OUTB.

When a magnetic field whose magnetic flux density is equal to or larger than the reference voltage VTH1, or the reference voltage VTH2 is applied to the Hall element HAL1, in other words, when the magnetic flux density of a magnetic field applied to the Hall element HAL1 is higher than a magnetic detection point, the sensor circuit detects the magnetic field and outputs a High signal (magnetic detection operation). When a magnetic field whose magnetic flux density is equal to or larger than the reference voltage VTH1 or the reference voltage VTH2 is no longer applied to the Hall element HAL1, in other words, when the magnetic flux density of a magnetic field applied to the Hall element HAL1 is lower than a magnetic detection cancellation point, the sensor circuit cancels magnetic detection and outputs a Low signal (magnetic detection cancellation operation). The magnetic detection point is determined based on the reference voltage VTH1 or the reference voltage VTH2. The magnetic detection cancellation point is determined based on the reference voltage VTH1 or the reference voltage VTH2.

Figure 2:
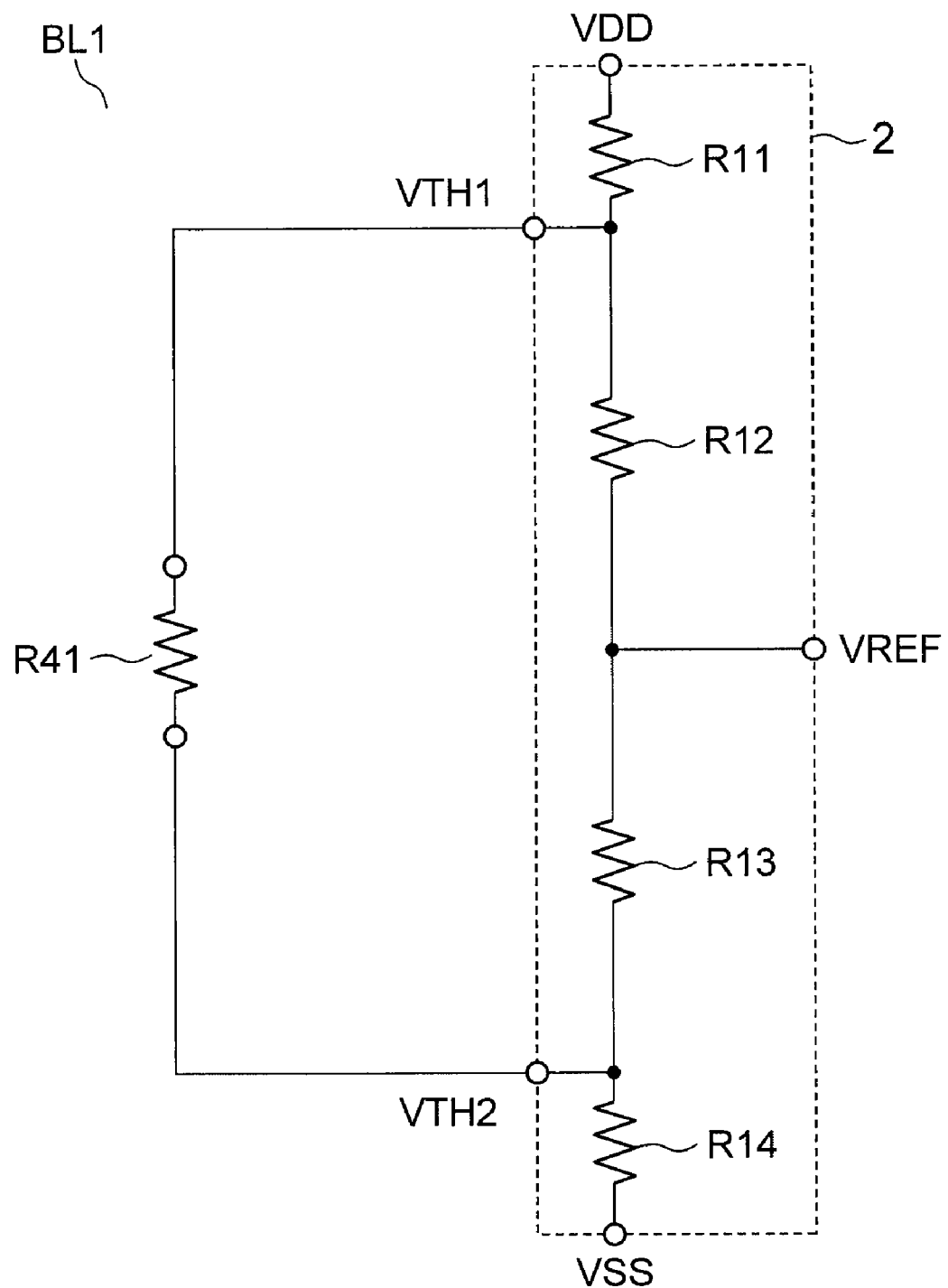
FIG. 2 is a diagram illustrating a reference voltage circuit.
Figure 3:
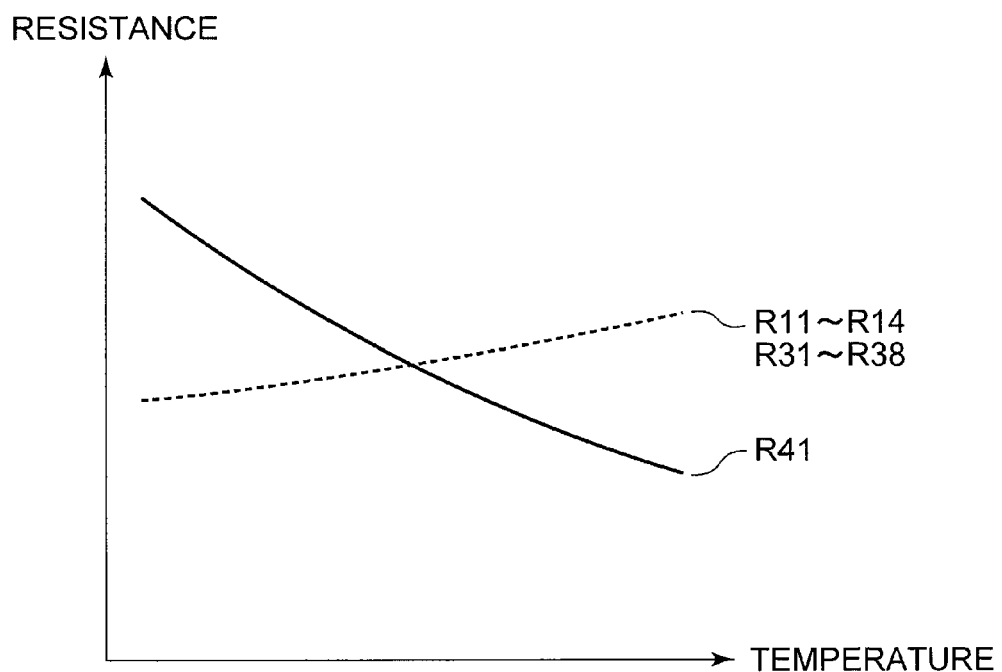
FIG. 3 is a diagram illustrating a change in resistance in relation to a change in temperature.
Figure 4:
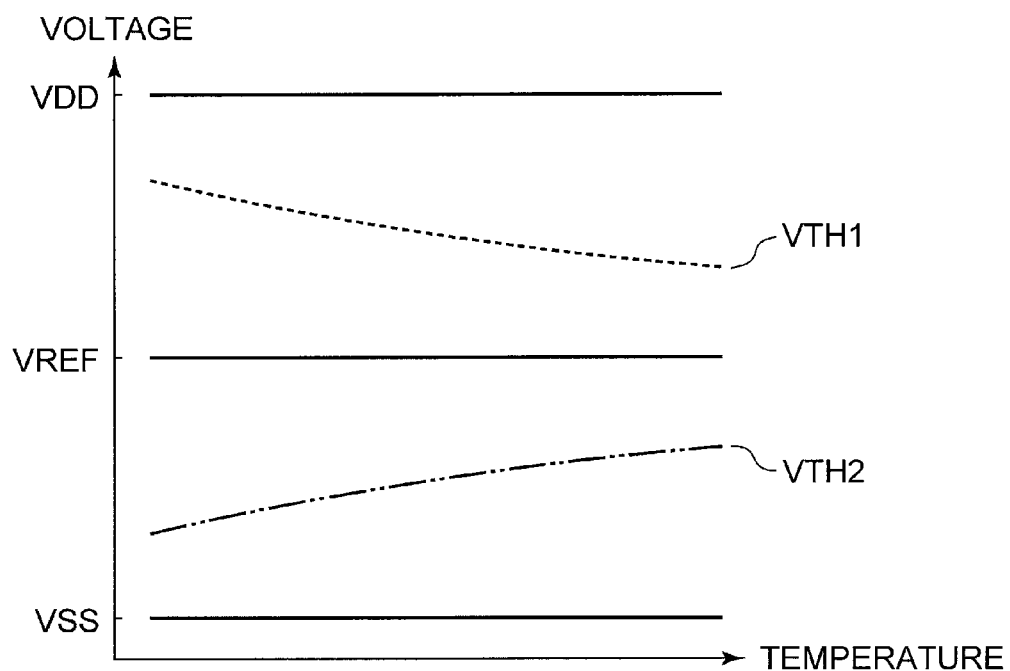
FIG. 4 is a diagram illustrating a change in reference voltage in relation to a change in temperature.

The reference voltage circuit BL1 is described next. FIG. 2 is a diagram illustrating the reference voltage circuit. FIG. 3 is a diagram illustrating a change in resistance in relation to a change in temperature. FIG. 4 is a diagram illustrating a change in reference voltage in relation to a change in temperature.

The reference voltage circuit BL1 includes a temperature compensating resistor R41 and a voltage divider circuit 2. The voltage divider circuit 2 has resistors R11 to R14.

The resistors R11 to R14 are serially connected in order between the supply terminal and the ground terminal. The reference voltage terminal is placed at the connection point between the resistor R12 and the resistor R13. The first output terminal is placed at the connection point between the resistor R11 and the resistor R12. The second output terminal is placed at the connection point between the resistor R13 and the resistor R14. The temperature compensating resistor R41 is placed between the first output terminal and the second output terminal.

The reference voltage circuit BL1 not only outputs reference voltages but also compensates the temperature in the sensor circuit.

As illustrated in FIG. 3, the resistors R11 to R14 have the same temperature coefficient and the same resistance value. The temperature coefficient of the resistors R11 to R14 is larger than that of the temperature compensating resistor R41.

When a resistance value between the first output terminal and the second output terminal is given as RX, the reference voltage VTH1, which is a reference voltage at the connection point between the resistor R11 and the resistor R12 (first output terminal), is calculated by the following expression:

$$VTH1 = VDD \times (RX+R14)/(R11+RX+R14) \quad (1)$$

The reference voltage VTH2, which is a reference voltage at the connection point between the resistor R13 and the resistor R14 (second output terminal), is calculated by the following expression:

$$VTH2 = VDD \times R14/(R11+RX+R14) \quad (2)$$

Then, with R11 to R14 assumed to have the same value (R11=R12=R13=R14) for the sake of convenience, the reference voltage VTH1 and the reference voltage VTH2 are expressed as follows:

$$VTH1 = VDD \times (RX/R11+1)/(2+RX/R11) \quad (3)$$

$$VTH2 = VDD \times 1/(2+RX/R11) \quad (4)$$

As the temperature rises, the term "RX/R11" decreases, which makes the reference voltage VTH1 smaller and the reference voltage VTH2 larger as illustrated in FIG. 4.

A reference voltage VREF is calculated by the following expression:

$$VREF = VDD/2 \quad (5)$$

The following relations are therefore satisfied:

$$VTH1 - VREF = VDD \times (RX/R11)/\{2 \times (2+RX/R11)\} \quad (6)$$

$$VTH2 - VREF = -VDD \times (RX/R11)/\{2 \times (2+RX/R11)\} \quad (7)$$

Accordingly, "VTH2−VREF" can be expressed as follows:

$$VTH2 - VREF = -(VTH1 - VREF) \quad (8)$$

This means that the reference voltages VTH1 and VTH2 have temperature coefficients axisymmetric with respect to the reference voltage VREF as illustrated in FIG. 4.

Figure 5:
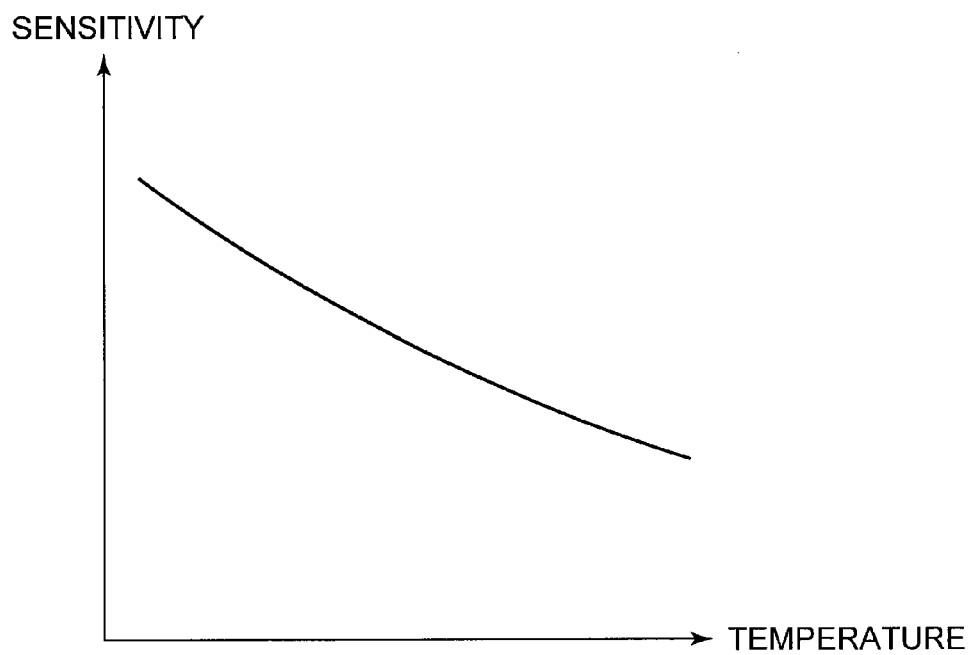
FIG. 5 is a diagram illustrating a change in sensitivity of a Hall element in relation to a change in temperature.

The Hall element HAL1 is described next. FIG. 5 is a diagram illustrating a change in sensitivity of the Hall element in relation to a change in temperature.

The sensitivity of the Hall element HAL1 (the output signal of the Hall element HAL1 which is output when a magnetic field is applied to the Hall element HAL1) has a temperature coefficient as illustrated in FIG. 5. A rise in temperature lowers the sensitivity of the Hall element HAL1.

As the output signal of the Hall element HAL1 has a temperature coefficient, the output signal OUTA of the amplifier circuit AMP1 also has a temperature coefficient. Therefore, if the reference voltages VTH1 and VTH2 do not have a temperature coefficient, the magnetic detection point and the magnetic detection cancellation point have apparent temperature coefficients. In other words, the temperature coefficients of the magnetic detection point and the magnetic detection cancellation point are seemingly dependent on the temperature coefficient of the sensitivity of the Hall element HAL1.

However, in the present invention, the temperature coefficients of the reference voltages VTH1 and VTH2 are matched to the temperature coefficient of the output signal OUTA of the amplifier circuit AMP1, which is based on the temperature coefficient of the sensitivity of the Hall element HAL1, by adjusting the temperature coefficients and resistance values of the resistors R11 to R14 and the temperature compensating resistor R41. Therefore, when the output signal of the Hall element HAL1 undergoes a temperature change, causing a temperature change of the output signal OUTA of the amplifier circuit AMP1, the temperature changes that much for the reference voltages VTH1 and VTH2, with the result that the magnetic detection point and the magnetic detection cancellation point no longer have apparent temperature coefficients. In short, the magnetic detection point and the magnetic detection cancellation point can be set to any value by adjusting the temperature coefficients and resistance values of the resistors R11 to R14 and the temperature compensating resistor R41.

The switch circuit SW1 is described next.

The switch circuit SW1 has the first input terminal, the second input terminal, and one output terminal.

The positive/negative polarity of the output signal of the Hall element HAL1 is inverted depending on the direction of a magnetic field applied to the Hall element HAL1, and the positive/negative polarity of the output signal OUTA of the amplifier circuit AMP1, too, is inverted accordingly. Based on the direction of the magnetic field, the switch circuit SW1 chooses one of the reference voltages VTH1 and VTH2, and outputs the chosen voltage as the reference voltage OUTB. The output signal OUTA which reflects the positive/negative polarity of the amplifier circuit AMP1 has temperature coefficients axisymmetric with respect to the reference voltage VREF. The reference voltages VTH1 and VTH2 have temperature coefficients axisymmetric with respect to the reference voltage VREF. Accordingly, when a magnetic field applied to the Hall element HAL1 has a forward direction and the polarity of the output signal OUTA of the amplifier circuit AMP1 is positive, for example, the switch circuit SW1 outputs the reference voltage VTH1 as the reference voltage OUTB. When the magnetic field has a reverse direction and the polarity of the output signal OUTA is negative, the switch circuit SW1 outputs the reference voltage VTH2 as the reference voltage OUTB.

This way, the reference voltage circuit BL1 which performs temperature compensation has only the temperature compensating resistor R41 and the voltage divider circuit 2. The sensor circuit is thus reduced in circuit scale.

The sensor circuit is also capable of temperature compensation because, when a temperature change of the output signal of the Hall element HAL1 causes a temperature change of the output signal OUTA of the amplifier circuit AMP1, the temperature changes that much for the reference voltages VTH1 and VTH2 as well, with the result that the magnetic detection point and the magnetic detection cancellation point no longer have apparent temperature coefficients.

The positive/negative polarity of the output signal of the Hall element HAL1 is inverted depending on the direction of a magnetic field applied to the Hall element HAL1, which inverts the positive/negative polarity of the output signal OUTA of the amplifier circuit AMP1. Even in such a case, a polarity inversion of the output signal OUTA does not prevent the output signal OUTA which reflects the positive/negative polarity of the amplifier circuit AMP1 from having temperature coefficients axisymmetric with respect to the reference voltage VREF, and does not prevent the reference voltages VTH1 and VTH2 from having temperature coefficients axisymmetric with respect to the reference voltage VREF. Therefore, the magnetic detection point and the magnetic detection cancellation point do not have apparent temperature coefficients and the sensor circuit thus accomplishes temperature compensation.

The reference voltages VTH1 and VTH2 are generated by resistors connected between the supply terminal and the ground terminal. Consequently, the reference voltages VTH1 and VTH2 are in proportion to the supply voltage VDD, and the output signal of the Hall element HAL1, too, is in proportion to the supply voltage VDD. The magnetic detection point and the magnetic detection cancellation point are therefore not dependent on the supply voltage VDD.

In addition, the reference voltage circuit BL1 is small in circuit scale because the reference voltages VTH1 and VTH2 are generated by a single voltage divider circuit.

The temperature coefficients of the reference voltages VTH1 and VTH2 vary in the same manner depending on the temperature compensating resistor R41. If the temperature compensating resistor R41 fluctuates due to production tolerance, the absolute values of the reference voltages VTH1 and VTH2 fluctuate in the same manner.

The description given above uses, as the sensor element of the sensor circuit, the Hall element HAL1 which outputs an output signal having a temperature coefficient based on the magnetic flux density and direction of an applied magnetic field. Instead, a sensor element that outputs an output signal having a temperature coefficient based on some external factor may be employed.

The resistors R11 to R14, which have the same temperature coefficient and the same resistance value for the sake of convenience, may have a temperature coefficient and a resistance value that are adjusted based on desired values of the reference voltages VTH1 and VTH2. The same applies to the temperature compensating resistor R41.

Although not illustrated in the drawings, the reference voltage circuit BL1, which is connected directly between the supply terminal and the ground terminal, may be connected via a switch circuit. The switch circuit is switched off when the reference voltage circuit BL1 is not needed, with the result that power supply to the reference voltage circuit BL1 is cut off, reducing the current consumption of the reference voltage circuit BL1 to substantially zero.

Second Embodiment

Figure 6:
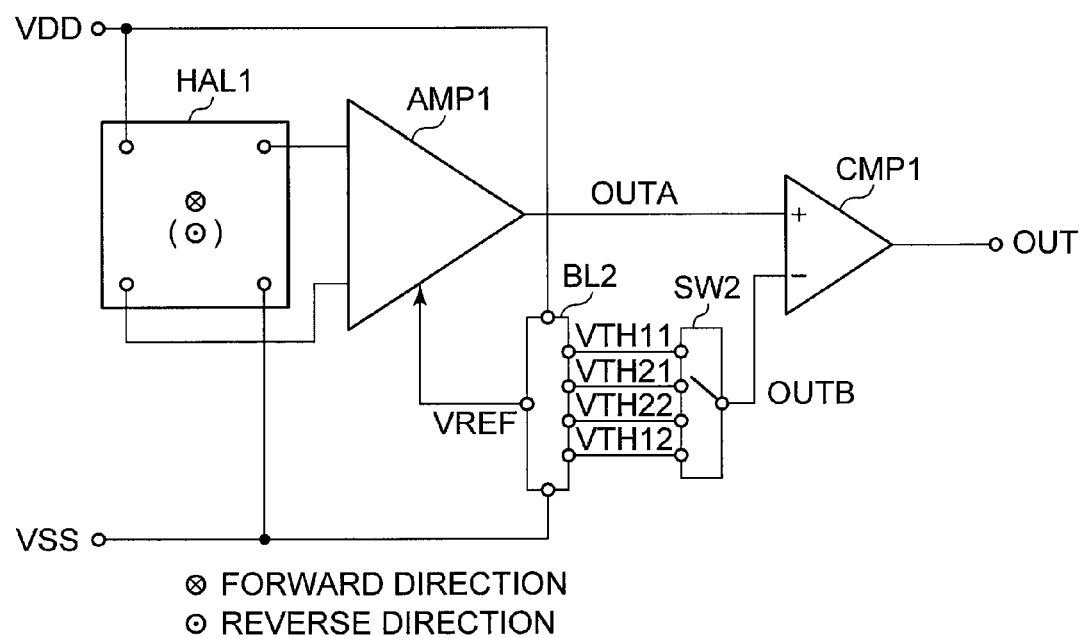
FIG. 6 is a diagram illustrating another sensor circuit.

The structure of a sensor circuit is described next. FIG. 6 is a diagram illustrating the sensor circuit.

The sensor circuit of the second embodiment includes a reference voltage circuit BL2 and a switch circuit SW2, which respectively replace the reference voltage circuit BL1 and the switch circuit SW1 in the sensor circuit of the first embodiment.

The reference voltage circuit BL2 has a first output terminal, which is connected to a first input terminal of the switch circuit SW2, a second output terminal, which is connected to a second input terminal of the switch circuit SW2, a third output terminal, which is connected to a third input terminal of the switch circuit SW2, and a fourth output terminal, which is connected to a fourth input terminal of the switch circuit SW2.

The operation of the sensor circuit is described next.

In the sensor circuit of the second embodiment, the switch circuit SW2 chooses out of four reference voltages instead of two which is the number of reference voltage options in the sensor circuit of the first embodiment.

Figure 7:
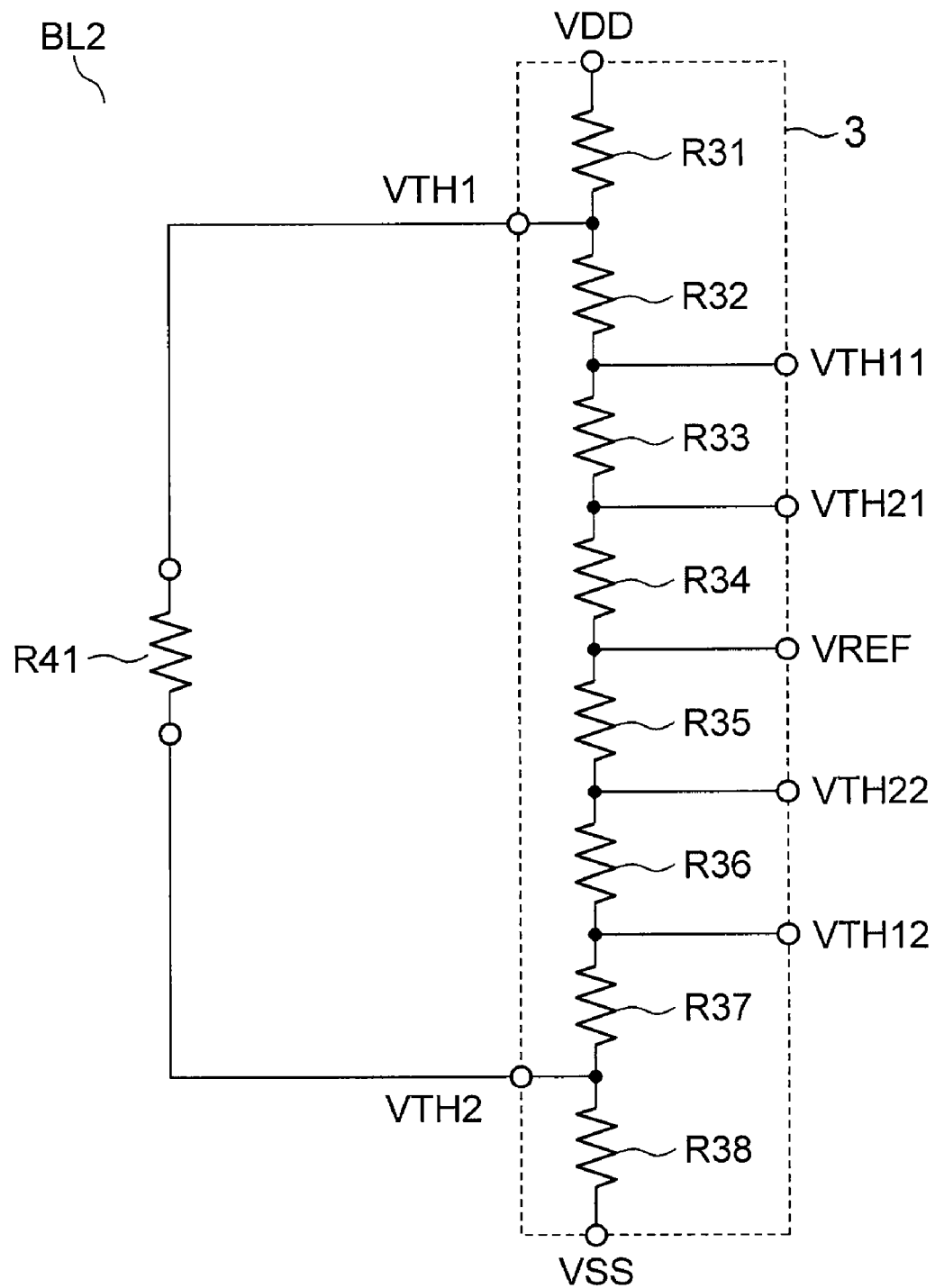
FIG. 7 is a diagram illustrating another reference voltage circuit.
Figure 8:
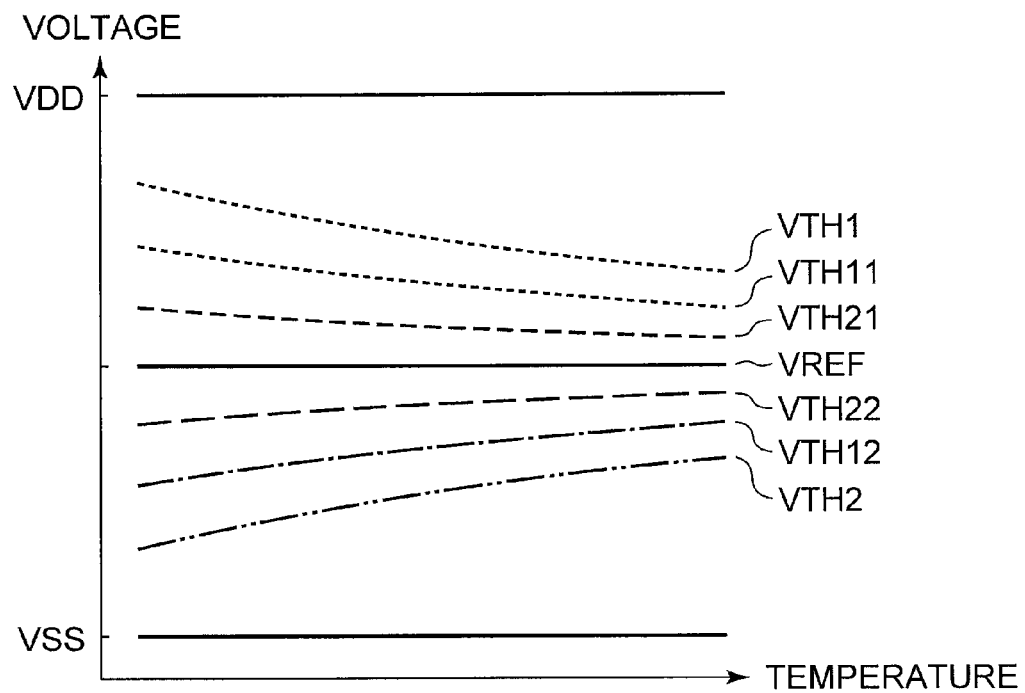
FIG. 8 is a diagram illustrating a change in reference voltage in relation to a change in temperature.

The reference voltage circuit BL2 is described next. FIG. 7 is a diagram illustrating the reference voltage circuit. FIG. 8 is a diagram illustrating a change in reference voltage in relation to a change in temperature.

The reference voltage circuit BL2 includes temperature compensating resistors R41 and a voltage divider circuit 3. The voltage divider circuit 3 has resistors R31 to R38.

The resistors R31 to R38 are serially connected in order between the supply terminal and the ground terminal. The reference voltage terminal is placed at the connection point between the resistor R34 and the resistor R35. The fifth output terminal is placed at the connection point between the resistor R31 and the resistor R32. The first output terminal is placed at the connection point between the resistor R32 and the resistor R33. The second output terminal is placed at the connection point between the resistor R33 and the resistor R34. The third output terminal is placed at the connection point between the resistor R35 and the resistor R36. The fourth output terminal is placed at the connection point between the resistor R36 and the resistor R37. The sixth output terminal is placed at the connection point between the resistor R37 and the resistor R38. The temperature compensating resistor R41 is placed between the fifth output terminal and the sixth output terminal.

The reference voltages VTH1 and VTH2 in the second embodiment approximate voltages calculated by Expressions (1) to (4).

When R31 to R38 are assumed to have the same value (R31=R32=R33=R34=R35=R36=R37=R38) for the sake of convenience, a reference voltage VREF at the connection point between the resistor R34 and the resistor R35 is calculated by the following expression:

$$VREF = VDD/2 \quad (9)$$

A reference voltage VTH11 at the connection point between the resistor R32 and the resistor R33 (first output terminal) is calculated by the following expression:

$$VTH11 = VREF + (2/6) \times (VTH1 - VTH2) \quad (10)$$

A reference voltage VTH21 at the connection point between the resistor R33 and the resistor R34 (second output terminal) is calculated by the following expression:

$$VTH21 = VREF + (1/6) \times (VTH1 - VTH2) \quad (11)$$

A reference voltage VTH22 at the connection point between the resistor R35 and the resistor R36 (third output terminal) is calculated by the following expression:

$$VTH22 = VREF - (1/6) \times (VTH1 - VTH2) \quad (12)$$

A reference voltage VTH12 at the connection point between the resistor R36 and the resistor R37 (fourth output terminal) is calculated by the following expression:

$$VTH12 = VREF - (2/6) \times (VTH1 - VTH2) \quad (13)$$

The following relations are therefore satisfied:

$$VTH11 - VREF = -(VTH12 - VREF) \quad (14)$$

$$VTH21 - VREF = -(VTH22 - VREF) \quad (15)$$

Accordingly, as illustrated in FIG. 8, the reference voltages VTH11 and VTH12 have temperature coefficients axisymmetric with respect to the reference voltage VREF, and the reference voltages VTH21 and VTH22, too, have temperature coefficients axisymmetric with respect to the reference voltage VREF.

The switch circuit SW2 is described next.

The switch circuit SW2 has the first input terminal, the second input terminal, the third input terminal, the fourth input terminal, and one output terminal.

The positive/negative polarity of the output signal of the Hall element HAL1 is inverted depending on the direction of a magnetic field applied to the Hall element HAL1, and the positive/negative polarity of the output signal OUTA of the amplifier circuit AMP1, too, is inverted accordingly. Based on the direction of the magnetic field, the switch circuit SW2 chooses one of the reference voltages VTH11 and VTH12 and the reference voltages VTH21 and VTH22, and outputs the chosen voltage as the reference voltage OUTB. The output signal OUTA which reflects the positive/negative polarity of the amplifier circuit AMP1 has temperature coefficients axisymmetric with respect to the reference voltage VREF. The reference voltages VTH11 and VTH12 have temperature coefficients axisymmetric with respect to the reference voltage VREF and the reference voltages VTH21 and VTH22 have temperature coefficients axisymmetric with respect to the reference voltage VREF. Accordingly, when a magnetic field applied to the Hall element HAL1 has a forward direction and the polarity of the output signal OUTA of the amplifier circuit AMP1 is positive, for example, the switch circuit SW2 outputs the reference voltage VTH11 or the reference voltage VTH21 as the reference voltage OUTB. When the magnetic field has a reverse direction and the polarity of the output signal OUTA is negative, the switch circuit SW2 outputs the reference voltage VTH12 or the reference voltage VTH22 as the reference voltage OUTB.

Figure 9:
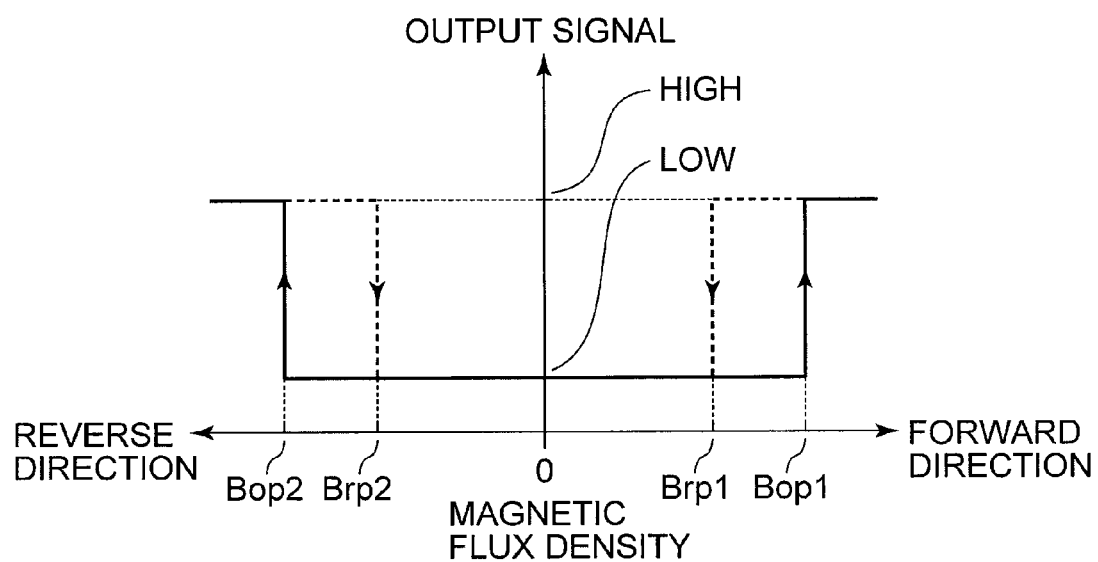
FIG. 9 is a diagram illustrating an output signal of the another sensor circuit.
Figure 10:
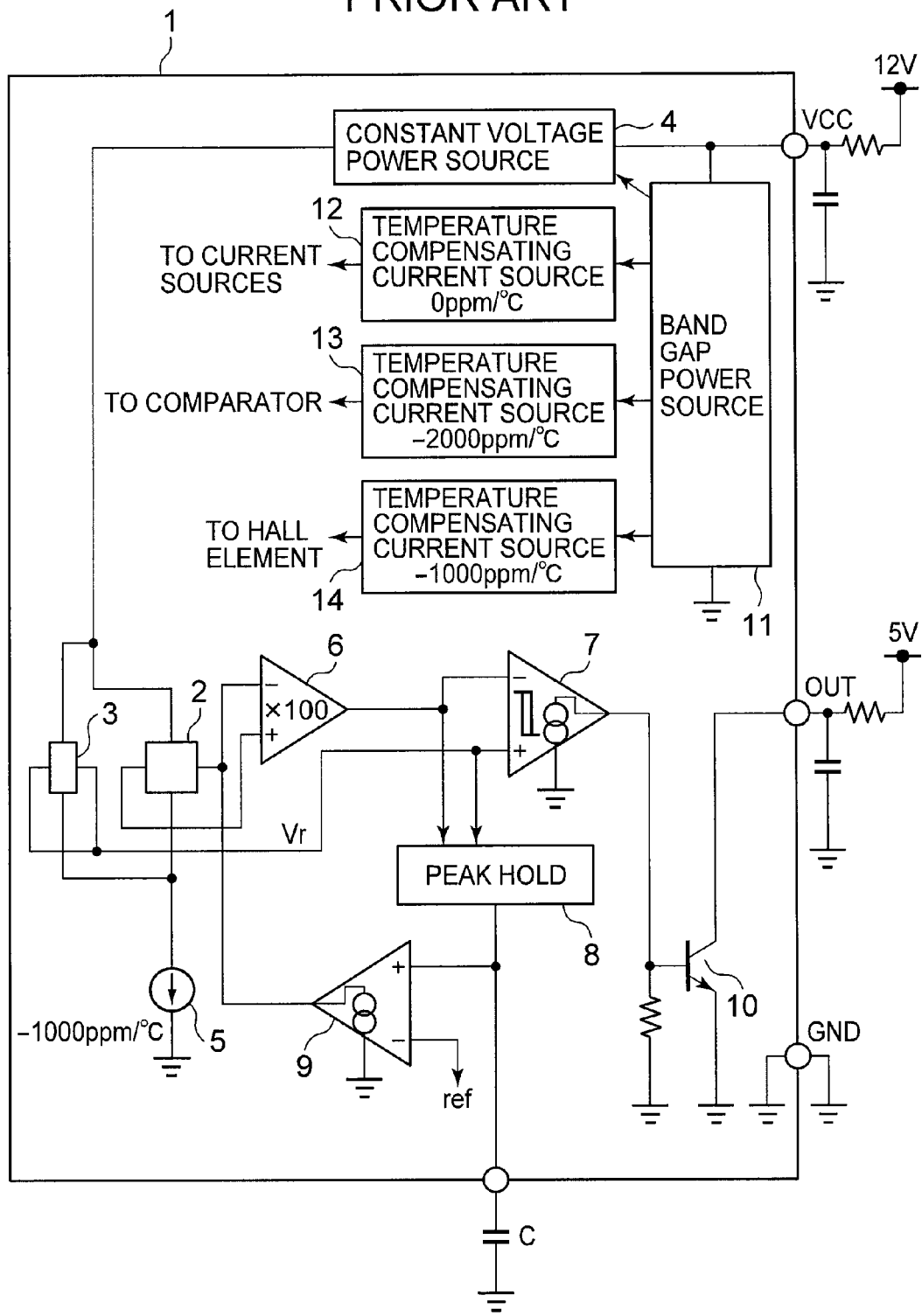
FIG. 10 is a diagram illustrating a temperature compensation circuit installed in a conventional magnetic sensor circuit.

This way, the increased number of reference voltages increases magnetic detection points and magnetic detection cancellation points in number, thereby enhancing the degree of freedom of the sensor circuit. For instance, as illustrated in FIG. 9, a selection between two options, a magnetic detection point Bop1 and a magnetic detection point Bop2, may be made based on the reference voltage VTH11 or the reference voltage VTH12. Further, a selection between two options, a magnetic detection cancellation point Brp1 and a magnetic detection cancellation point Brp2, may be made based on the reference voltage VTH21 or the reference voltage VTH22. In this case, when the direction of a magnetic field applied to the Hall element HAL1 is forward and the magnetic flux density of the magnetic field is higher than the magnetic detection point Bop1, the sensor circuit outputs a High signal. When the direction of the magnetic field is reverse and the magnetic flux density of the magnetic field is higher than the magnetic detection point Bop2, the sensor circuit outputs a High signal. When the direction of the magnetic field is forward and the magnetic flux density of the magnetic field is lower than the magnetic detection cancellation point Brp1, the sensor circuit outputs a Low signal. When the direction of the magnetic field is reverse and the magnetic flux density of the magnetic field is lower than the magnetic detection cancellation point Brp2, the sensor circuit outputs a Low signal. In short, there are hysteresis characteristics between magnetic flux densities at a magnetic detection point and a magnetic detection cancellation point. In FIG. 9, the sensor circuit outputs a High signal when the magnetic flux density of a magnetic field applied to the Hall element HAL1 is higher than a magnetic detection point. Alternatively, though not illustrated in the drawings, the sensor circuit may output a Low signal. The same applies to magnetic detection cancellation points. The sensor circuit includes a signal processing circuit (not shown) downstream of the comparator circuit CMP1, and the signal processing circuit stores a past output signal of the sensor circuit in order to implement hysteresis characteristics. When the past output signal of the sensor circuit is high and the current output signal of the sensor circuit is low, the sensor circuit operates at a magnetic detection cancellation point. When the past output signal of the sensor circuit is low and the current output signal of the sensor circuit is high, the sensor circuit operates at a magnetic detection point.

What is claimed is:

1. A sensor circuit comprising:
   a sensor element which outputs an output signal that has a first temperature coefficient based on an external factor;
   an amplifier circuit which amplifies the output signal of the sensor element, and which outputs an output signal that has a second temperature coefficient based on the first temperature coefficient;
   a reference voltage circuit which includes a voltage divider circuit and a temperature compensating resistor, and which outputs a reference voltage, the voltage divider circuit including a plurality of resistors that have the same temperature coefficient, the temperature compensating resistor having a temperature coefficient different from the temperature coefficient of the plurality of resistors, the reference voltage having a third temperature coefficient, which is substantially equal to the second temperature coefficient; and
   a comparator circuit which compares the output signal of the amplifier circuit and the reference voltage of the reference voltage circuit to output one of a High signal and a Low signal when the output signal of the amplifier circuit is equal to or larger than the reference voltage of the reference voltage circuit, and to output another one of the Low signal and the High signal when the output signal of the amplifier circuit is smaller than the reference voltage of the reference voltage circuit.

2. A sensor circuit according to claim 1, wherein the sensor element includes a Hall element that outputs an output signal based on a magnetic flux density and direction of an applied magnetic field.

3. A sensor circuit according to claim 1, further comprising a first switch circuit which cuts off power supply to the reference voltage circuit.

4. A sensor circuit according to claim 1, wherein the sensor element outputs an output signal based on the external factor and a supply voltage.

5. A sensor circuit according to claim 1, wherein the reference voltage circuit includes:
   a first resistor, a second resistor, a third resistor, and a fourth resistor which are serially connected in the stated order between a supply terminal and a ground terminal;
   a reference voltage terminal which is placed at a connection point between the second resistor and the third resistor;
   a first output terminal which is placed at a connection point between the first resistor and the second resistor;
   a second output terminal which is placed at a connection point between the third resistor and the fourth resistor; and
   the temperature compensating resistor which is placed between the first output terminal and the second output terminal.

6. A sensor circuit according to claim 1, wherein the reference voltage circuit includes:
   a first resistor, a second resistor, a third resistor, a fourth resistor, a fifth resistor, a sixth resistor, a seventh resistor, and an eighth resistor which are serially connected in the stated order between a supply terminal and a ground terminal;
   a reference voltage terminal which is placed at a connection point between the fourth resistor and the fifth resistor;
   a fifth output terminal which is placed at a connection point between the first resistor and the second resistor;
   a first output terminal which is placed at a connection point between the second resistor and the third resistor;
   a second output terminal which is placed at a connection point between the third resistor and the fourth resistor;
   a third output terminal which is placed at a connection point between the fifth resistor and the sixth resistor;
   a fourth output terminal which is placed at a connection point between the sixth resistor and the seventh resistor;
   a sixth output terminal which is placed at a connection point between the seventh resistor and the eighth resistor; and
   the temperature compensating resistor which is placed between the fifth output terminal and the sixth output terminal.

* * * * *